(12) United States Patent
Kim et al.

(10) Patent No.: US 10,971,702 B2
(45) Date of Patent: Apr. 6, 2021

(54) DISPLAY DEVICE HAVING A LOW REFRACTIVE INDEX LAYER AND A HIGH REFRACTIVE INDEX LAYER

(71) Applicant: SAMSUNG DISPLAY CO., LTD., Yongin-si (KR)

(72) Inventors: Suk Kim, Hwaseong-si (KR); Gee-Bum Kim, Seoul (KR); Sung Kook Park, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 22 days.

(21) Appl. No.: 15/894,334

(22) Filed: Feb. 12, 2018

(65) Prior Publication Data

US 2019/0013495 A1     Jan. 10, 2019

(30) Foreign Application Priority Data

Jul. 4, 2017    (KR) ........................ 10-2017-0084946

(51) Int. Cl.
     *H01L 51/52*        (2006.01)
     *H01L 27/32*        (2006.01)

(52) U.S. Cl.
CPC ...... *H01L 51/5275* (2013.01); *H01L 27/3246* (2013.01); *H01L 27/3248* (2013.01); *H01L 27/3216* (2013.01); *H01L 27/3218* (2013.01)

(58) Field of Classification Search
CPC ............. H01L 51/5275; H01L 27/3246; H01L 27/3248
See application file for complete search history.

(56) References Cited

U.S. PATENT DOCUMENTS

| | | | | |
|---|---|---|---|---|
| 2002/0047567 | A1* | 4/2002 | Fujita | H01L 27/3248 315/169.3 |
| 2004/0223100 | A1* | 11/2004 | Kotchick | G02F 1/1335 349/114 |
| 2014/0008618 | A1* | 1/2014 | Lim | H01L 51/5268 257/40 |
| 2015/0048333 | A1* | 2/2015 | Choi | H01L 51/5275 257/40 |
| 2015/0123085 | A1* | 5/2015 | Kim | H01L 51/5281 257/40 |

(Continued)

FOREIGN PATENT DOCUMENTS

| KR | 10-2010-0073228 | 7/2010 |
|---|---|---|
| KR | 10-2015-0076070 | 7/2015 |
| KR | 10-1676901 | 11/2016 |

*Primary Examiner* — Stephen M Bradley
*Assistant Examiner* — Gustavo G Ramallo
(74) *Attorney, Agent, or Firm* — F. Chau & Associates, LLC

(57) ABSTRACT

A display device includes a substrate. A first electrode is disposed on the substrate. A pixel definition layer is disposed on the substrate. A second electrode is disposed on the first electrode and the pixel definition layer. An organic emission layer is disposed between the first electrode and the second electrode. A planarization layer is disposed on the second electrode. A low refractive index layer is disposed on the planarization layer and overlaps the pixel definition layer. A high refractive index layer is disposed on the planarization layer and overlaps the second electrode. The high refractive index layer has a higher refractive index than that of the low refractive index layer.

38 Claims, 14 Drawing Sheets

(56) References Cited

U.S. PATENT DOCUMENTS

| | | | |
|---|---|---|---|
| 2015/0123086 A1* | 5/2015 | Lee | H01L 51/5275 |
| | | | 257/40 |
| 2016/0087245 A1* | 3/2016 | Park | H01L 51/524 |
| | | | 257/40 |
| 2016/0260792 A1* | 9/2016 | Kim | H01L 27/3276 |
| 2017/0141349 A1* | 5/2017 | Kwak | H01L 51/56 |
| 2017/0179211 A1* | 6/2017 | Kanaya | H01L 27/3258 |
| 2018/0122875 A1* | 5/2018 | Bang | H01L 51/5212 |

* cited by examiner

DISPLAY DEVICE HAVING A LOW REFRACTIVE INDEX LAYER AND A HIGH REFRACTIVE INDEX LAYER

CROSS-REFERENCE TO RELATED APPLICATION

This application claims priority to and the benefit of Korean Patent Application No. 10-2017-0084946 filed in the Korean Intellectual Property Office on Jul. 4, 2017, the entire contents of which are herein incorporated by reference.

TECHNICAL FIELD

The present disclosure relates to a display device, and more particularly, to a display device having a low refractive index layer and a high refractive index layer.

DISCUSSION OF THE RELATED ART

An organic light emitting diode (OLED) display includes two electrodes and an organic emission layer interposed therebetween. Electrons are injected to the organic emission layer from one of the two electrodes and holes are injected to the organic emission layer from the other of the two electrodes. The electrons and holes are combined in the organic emission layer to generate excitons. As the generated excitons relax to a ground state from an exited state, light is emitted.

The organic light emitting diode (OLED) display includes a plurality of pixels including an organic light emitting diode as a self-emissive element. A plurality of transistors for driving the organic light emitting diode and at least one capacitor are formed in each pixel. The transistors generally include a switching transistor and a driving transistor.

A considerable amount of light emitted from the organic light emitting diode is lost as the light passes through several layers of the display.

SUMMARY

A display device includes a substrate. A first electrode is disposed on the substrate. A pixel definition layer is disposed on the substrate. A second electrode is disposed on the first electrode and the pixel definition layer. An organic emission layer is disposed between the first electrode and the second electrode. A planarization layer is disposed on the second electrode. A low refractive index layer is disposed on the planarization layer and overlaps the pixel definition layer. A high refractive index layer is disposed on the planarization layer and overlaps the second electrode. The high refractive index layer has a higher refractive index than that of the low refractive index layer.

The low refractive index layer may have a tapered shape.

A taper angle $\theta$ of the low refractive index layer may satisfy a following equation:

$$a \sin d\left(\frac{n1}{n2}\right) \leq \theta < 90°,$$

wherein n1 is a refractive index of the low refractive index layer, n2 is a refractive index of the high refractive index layer, and asind (x) represents an angle in degrees.

The high refractive index layer may contact the low refractive index layer.

The high refractive index layer may at least partially cover the low refractive index layer.

A top surface of the high refractive index layer may be substantially planar.

A thickness of the low refractive index layer may be 4 µm or more and 8 µm or less.

The thickness of the low refractive index layer may be 5 µm.

An emission region may be separated from the low refractive index layer.

The emission region might not vertically overlap the low refractive index layer.

A horizontal distance between the emission region and the low refractive index layer may be 0.5 µm or more and 3 µm or less.

The horizontal distance between the emission region and the low refractive index layer may be 1.5 µm.

A thickness of the planarization layer may be 4 µm or more and 10 µm or less.

A refractive index of the planarization layer may be greater than that of the low refractive index layer, and may be smaller than that of the high refractive index layer.

The substrate may include a plurality of pixels, and each of the plurality of pixels may be arranged in an orthogonal matrix form or a pentile matrix form.

An emission region of each of the plurality of pixels may have a circular shape.

An emission region of each of the plurality of pixels may have a polygonal shape.

The display device may further include a first buffer layer disposed between the second electrode and the planarization layer.

The display device may further include a second buffer layer disposed between the planarization layer and the low refractive index layer, and between the planarization layer and the high refractive index layer.

The display device may further include a polarizer disposed on the high refractive index layer.

The display device may further include a cover window disposed on the high refractive index layer.

The display device may further include a light blocking member disposed on the low refractive index layer.

The high refractive index layer may include a color filter.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE EMBODIMENTS

Figure 1:
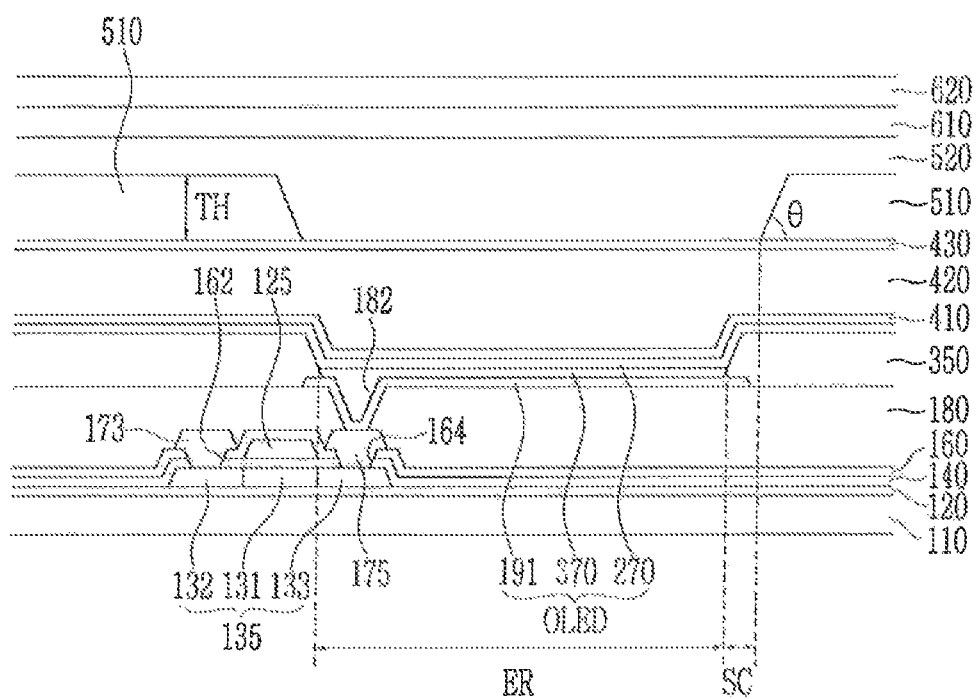
FIG. 1 is a cross-sectional view illustrating a display device according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, for better understanding and ease of description, the thicknesses and shapes of some layers and areas may be exaggerated.

It will be understood that when an element such as a layer, film, region, or substrate is referred to as being "on" another element, it can be directly on the other element or intervening elements may also be present.

First, a display device according to an exemplary embodiment will be described with reference to FIG. 1.

FIG. 1 is a cross-sectional view illustrating a display device according to an exemplary embodiment of the present invention.

As shown in FIG. 1, the display device, according to an exemplary embodiment of the present invention includes a substrate 110, an organic light emitting diode OLED disposed on the substrate 110, a planarization layer 420 disposed on the organic light emitting diode OLED, a low refractive index layer 510 disposed on the planarization layer 420, and a high refractive index layer 520 disposed on the low refractive index layer 510 and the high refractive index layer 520.

The substrate 110 may be an insulating substrate made of glass, quartz, ceramic, plastic, etc., or a metal substrate made of stainless steel or the like. The substrate 110 may be flexible, stretchable, foldable, bendable, and/or rollable. As the substrate 110 may be flexible, stretchable, foldable, bendable, and/or rollable, the display device may also be flexible, stretchable, foldable, bendable, and/or rollable.

A buffer layer 120 may be disposed on the substrate 110. The buffer layer 120 may be formed as a single layer of a silicon nitride ($SiN_x$), or as multiple layers in which a silicon nitride ($SiN_x$) and a silicon oxide (SiO) are stacked. The buffer layer 120 serves to flatten a surface while preventing undesirable materials such as impurities or moisture from permeating therethrough. The buffer layer 120 may be omitted. The buffer layer 120 may be formed to cover an entire top surface of the substrate 110.

A semiconductor 135 is disposed on the buffer layer 120. The semiconductor 135 may be made of a polycrystalline semiconductor material or an oxide semiconductor material. In addition, the semiconductor 135 includes a channel region 131 in which impurities are not doped, and contact doping regions 132 and 133 that are disposed at opposite sides of the channel region 131 and in which impurities are doped. The contact doping regions 132 and 133 include a source region 132 and a drain region 133. The impurities used to dope the contact doping regions 132 and 133 may vary depending on a kind of the thin film transistor.

A gate insulating layer 140 is disposed on the semiconductor 135. The gate insulating layer 140 may be made of an inorganic insulating material such as a silicon nitride ($SiN_x$) or a silicon oxide ($SiO_x$).

A gate electrode 125 is disposed on the gate insulating layer 140. The gate electrode 125 may overlap at least some of the semiconductor 135, and may overlap the channel region 131. In this case, "overlap" may mean to be disposed on top of another element in a vertical direction in a cross-sectional view.

An interlayer insulating layer 160 is disposed on the gate electrode 125 and the gate insulating layer 140. The interlayer insulating layer 160 may be made of the inorganic insulating material or the organic insulating material.

Contact holes 162 and 164 overlapping at least part of the semiconductor 135 are formed in the gate insulating layer 140 and the interlayer insulating layer 160. The contact holes 162 and 164 respectively expose the contact doping regions 132 and 133 of the semiconductor 135.

A source electrode 173 and a drain electrode 175 are disposed on the interlayer insulating layer 160. In addition, the source electrode 173 and the drain electrode 175 are connected to the source region 132 and the drain region 133 of the semiconductor 135 through the contact holes 162 and 164, respectively.

As described above, the semiconductor 135, the gate electrode 125, the source electrode 173, and the drain electrode 175 comprise one thin film transistor. A structure of the thin film transistor is not limited to the aforementioned example, and may be modified to a variety of alternative structures. The organic light emitting diode display may include a switching transistor and a driving transistor, and the aforementioned thin film transistor may be the driving transistor. Although not illustrated, a switching thin film transistor may be provided.

A passivation layer 180 is disposed on the thin film transistor and the interlayer insulating layer 160. The passivation layer 180 serves to remove and/or flatten out steps of the aforementioned structures, thereby increasing luminous efficiency of the organic light emitting diode to be formed thereon. A contact hole 182 overlapping at least some of the drain electrode 175 is formed in the passivation layer 180.

The passivation layer 180 may be formed of a polyacrylate resin, an epoxy resin, a phenolic resin, a polyamide resin, a polyimide resin, an unsaturated polyester resin, a polyphenylene resin, a polyphenylene sulfide resin, and/or benzocyclobutene (BCB).

The organic light emitting diode OLED is disposed on the passivation layer 180. The organic light emitting diode OLED includes a first electrode 191, a second electrode 270 disposed on the first electrode 191, and an organic emission layer 370 disposed between the first electrode 191 and the second electrode 270.

The first electrode 191 is disposed on the passivation layer 180. The pixel electrode 191 may be formed of a transparent conductive material such as indium-tin oxide (ITO), indium-zinc oxide (IZO), zinc oxide (ZnO), indium oxide (In$_2$O$_3$), or the like, or a reflective metal such as lithium (Li), calcium (Ca), lithium fluoride/calcium (LiF/Ca), lithium fluoride/aluminum (LiF/Al), aluminum (Al), silver (Ag), magnesium (Mg), gold (Au), or the like. The first electrode 191 is electrically connected to the drain electrode 175 of the thin film transistor via the contact hole 182 formed in the passivation layer 180, to serve as an anode of the organic light emitting diode.

The first electrode 191 may include first and second transparent electrodes including a transparent conductive material, and a semi-transmissive layer disposed between the first and second transparent electrodes to form a microcavity together with the second electrode 270. For example, the first electrode 191 may be formed as multiple layers including a layer made of the transparent conductive material and a layer made of a reflective metal material.

A pixel definition layer 350 is disposed on an edge portion of the first electrode 191 and on the passivation layer 180. The pixel definition layer 350 may include a resin such as a polyacrylate resin and a polyimide resin, and/or a silica-based inorganic material.

The organic emission layer 370 is disposed on the first electrode 191. The organic emission layer 370 may include an emission layer, a hole-injection layer (HIL), a hole-transport layer (HTL), an electron-transport layer (ETL), and/or an electron-injection layer (EIL).

The organic emission layer 370 may include one of a red organic emission layer for emitting red light, a green organic emission layer for emitting green light, and a blue organic emission layer for emitting blue light. The red organic emission layer, the green organic emission layer, and the blue organic emission layer are respectively disposed at different pixels to implement a color image by a combination of differently colored pixels.

Alternatively, the organic emission layer 370 may have a structure in which the red organic emission layer, the green organic emission layer, and the blue organic emission layer are respectively stacked on corresponding pixels. In this case, a color image may be implemented by forming a red filter, a green filter, or a blue filter for each pixel. In another example, by forming a white organic emission layer for emitting white light at each pixel and by forming a red filter, a green filter, and a blue filter for each pixel, a color image may be implemented. When the color image is implemented by using the white organic emission layer and the color filter, a deposition mask for respectively depositing the red organic emission layer, the green organic emission layer, and the blue organic emission layer on each corresponding pixel (the red pixel, the green pixel, and the blue pixel), is not required.

The white organic emission layer described herein may be formed as a single organic emission layer, and may be formed as a plurality of organic emission layers stacked so that the white light may be emitted. For example, a structure for emitting white light by combining at least one yellow organic emission layer with at least one blue organic emission layer, a structure for emitting white light by combining at least one cyan organic emission layer with at least one red organic emission layer, and a structure for emitting white light by combining at least one magenta organic emission layer with at least one green organic emission layer, may be included.

The second electrode 270 is disposed on the organic emission layer 370 and the pixel definition layer 350. The second electrode 270 may be made of a transparent conductive material such as indium tin oxide (ITO), indium zinc oxide (IZO), zinc oxide (ZnO), indium oxide (In$_2$O$_3$), etc., or a reflective metal such as lithium (Li), calcium (Ca), lithium fluoride/calcium (LiF/Ca), lithium fluoride/aluminum (LiF/Al), aluminum (Al), silver (Ag), magnesium (Mg), gold (Au), etc. The second electrode 270 serves as a cathode of the organic light emitting diode OLED.

The planarization layer 420 is disposed on the second electrode 270. A top surface of the second electrode 270 might not be flat. A portion of the second electrode 270 which overlaps the pixel definition layer 350 may protrude past other portions. This may be caused by the pixel definition layer 350 being thicker than other constituent elements. The planarization layer 420 may be formed of a transparent organic material. For example, the planarization layer 420 may be formed of a polyacrylate resin, an epoxy resin, a phenolic resin, a polyamide resin, a polyimide resin, an unsaturated polyester resin, a polyphenylene resin, a polyphenylene sulfide resin, and/or benzocyclobutene (BCB).

The planarization layer 420 is formed to be sufficiently thick such that a top surface thereof can be flattened. When the substrate 110 is bent to implement a flexible display device or the like, the planarization layer 420 may serve to absorb impact transmitted to elements such as the thin film transistor, the first electrode 191, and the second electrode 270 so as to increase safety of the elements.

A buffer layer 410 may be further disposed between the second electrode 270 and the planarization layer 420. The buffer layer 410 may be made of an inorganic insulating material, and may have a single layer or multiple layer structure. For example, the buffer layer 410 may be made of silicon oxynitride (SiON). The buffer layer 410 may serve to protect the organic light emitting diode OLED. The buffer layer 410 may be omitted in some cases.

The low refractive index layer 510 is disposed on the planarization layer 420 to overlap the pixel definition layer 350. The low refractive index layer 510 may overlap most regions of the pixel definition layer 350 other than a portion of an edge thereof. The low refractive index layer 510 is illustrated to not overlap the first electrode 191 at all, but may overlap a portion of the edge of the first electrode 191 in some cases.

Light is emitted in a region where the organic emission layer 370 is in contact with the first electrode 191 and the second electrode 270. Accordingly, a region where all of the first electrode 191, the organic emission layer 370, and the second electrode 270 are overlapped may be regarded as an emission region ER. The emission region ER where light generated from the organic emission layer 370 is emitted may be separated from the low refractive index layer 510. For example, the emission region ER might not overlap the low refractive index layer 510. A distance between the emission region ER and the low refractive index layer 510 and a thickness of the low refractive index layer 510 etc. will be further described later.

A side surface of the low refractive index layer 510 may be inclined with respect to the planarization layer 420. For example, the low refractive index layer 510 may have a tapered shape at ends thereof. A taper angle of the low refractive index layer 510 will be further described later.

The high refractive index layer 520 is disposed on the planarization layer 420 to overlap the second electrode 270. The high refractive index layer 520 may also overlap the pixel definition layer 350, and may be disposed on the low refractive index layer 510 to cover the low refractive index layer 510. The high refractive index layer 520 may be formed to cover an entire top surface of the substrate 110.

The high refractive index layer 520 may have a higher refractive index than the low refractive index layer 510.

The high refractive index layer 520 may be formed of a transparent organic material The high refractive index layer 520 may be formed to be sufficiently thick such that a top surface thereof is flattened (e.g. planar). The high refractive index layer 520 may be made of a material having a refractive index that is higher than a refractive index of a material that the low refractive index layer 510 is made of. The high refractive index layer 520 may contact the low refractive index layer 510. When the light generated in the emission region ER is introduced into the low refractive index layer 510 through the high refractive index layer 520, the light is totally reflected toward a front surface thereof.

Hereinafter, a taper angle of the low refractive index layer 510 for guiding the total reflection will be described with reference to FIG. 2.

Figure 2:
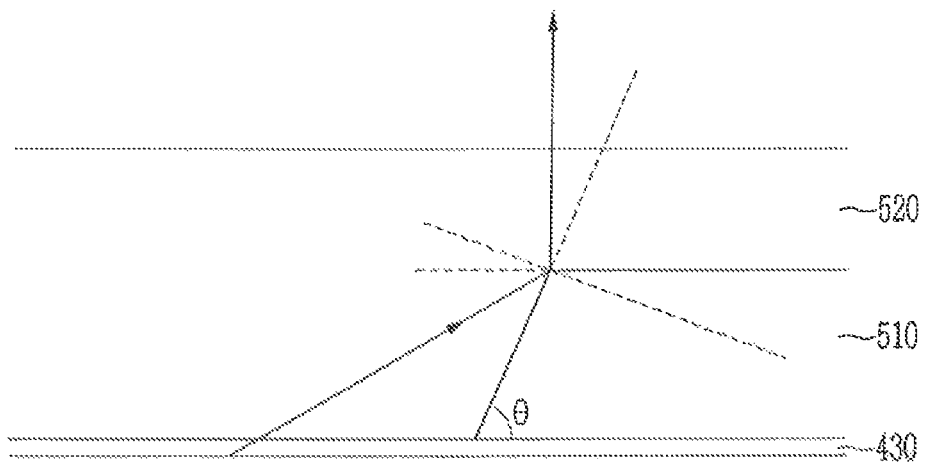
FIG. 2 is a cross-sectional view illustrating various layers of a display device according to an exemplary embodiment of the present invention.

FIG. 2 is a cross-sectional view illustrating some layers of a display device according to an exemplary embodiment of the present invention. FIG. 2 illustrates the buffer layer 430, the low refractive index layer 510, and the high refractive index layer 520, and a light path is indicated by an arrow.

Some of the light generated in the organic emission layer 370 may be emitted toward a front side of a screen, e.g., in a direction perpendicular to the substrate 110. Some of the light passes at an oblique angle relative to the substrate 110, and is introduced into the low refractive index layer 510 through the high refractive index layer 520. When passing from a medium with a high refractive index to a medium with a low refractive index, the light may be totally reflected at an interface therebetween, which is called total reflection in a case where an incidence angle is greater than a critical angle. A taper angle (θ) of the low refractive index layer 510 may be adjusted by using Equation 1 such that light introduced into the low refractive index layer 510 through the high refractive index layer 520 may be totally reflected.

$$asind\left(\frac{n1}{n2}\right) \le \theta < 90° \quad \text{[Equation 1]}$$

(n1: a refractive index of the low refractive index layer, n2: a refractive index of the high refractive index layer, θ: taper angle of the low refractive index layer with respect to a bottom horizontal surface of the low refractive index layer)

For example, the refractive index of the low refractive index layer 510 may be 1.5, and the refractive index of the high refractive index layer 520 may be 1.65. In this case, the taper angle (θ) of the low refractive index layer 510 may be 65.38° (asind (1.5/1.65)) or more, and 90° or less (where asind x represents an angle in degrees).

Here, an amount of light to be lost may be reduced by allowing the light introduced into the low refractive index layer 510 through the high refractive index layer 520 to be totally reflected and to be emitted toward the front side of the screen, thereby increasing the transmittance.

Hereinafter, a thickness of the low refractive index layer 510 and a distance between the emission region ER and the low refractive index layer 510 will be described with reference to FIG. 3 and FIG. 4.

Figure 3:
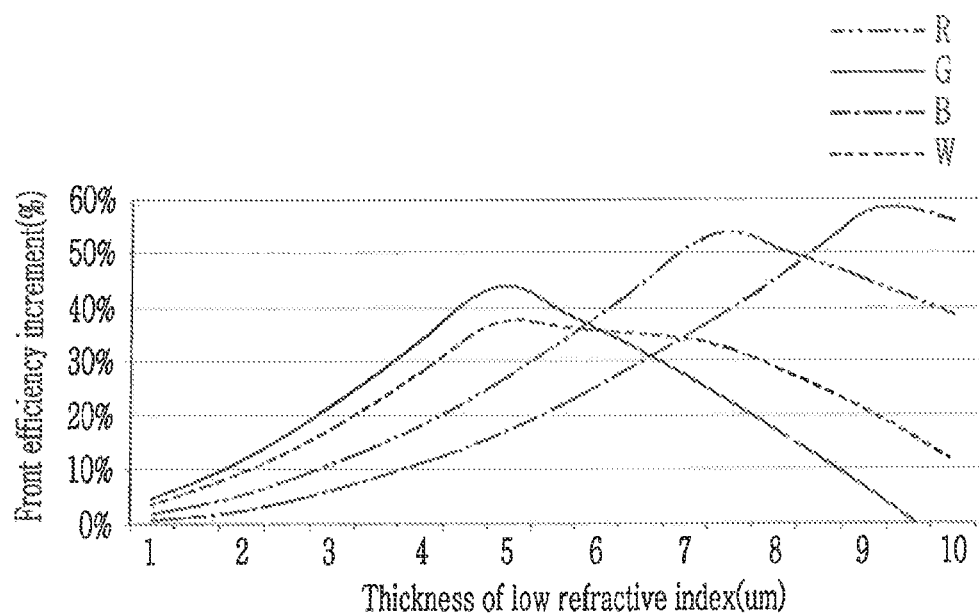
FIG. 3 is a graph illustrating a front efficiency increment with respect to a thickness of a low refractive index layer of a display device according to an exemplary embodiment of the present invention.

FIG. 3 is a graph illustrating a front efficiency increment with respect to a thickness of a low refractive index layer of a display device according to an exemplary embodiment of the present disclosure. The front efficiency increment indicates an increment in an amount of light that is emitted toward the front side of the screen. FIG. 4 is a graph illustrating a front efficiency increment with respect to a horizontal distance between a low refractive index layer and an emission region of a display device according to an exemplary embodiment of the present disclosure.

As shown in FIG. 3, as a thickness TH of the low refractive index layer 510 increases, the front efficiency increment tends to gradually increase and then decrease again at a certain point. Each of the red light, the green light, and the blue light have different points where the front efficiency increment is a maximum. For white light, it is seen that when the thickness TH of the low refractive index layer 510 is about 5 μm, the front efficiency is increased by 40% to a maximum. In addition, it is seen that when the thickness TH of the low refractive index layer 510 is about 4 μm or more and about 8 μm or less, the front efficiency is increased by about 30%. Accordingly, the thickness TH of the low refractive index layer 510 may preferably be about 4 μm or more and about 8 μm or less. Further, the thickness TH of the low refractive index layer 510 may more preferably be about 5 μm.

Figure 4:
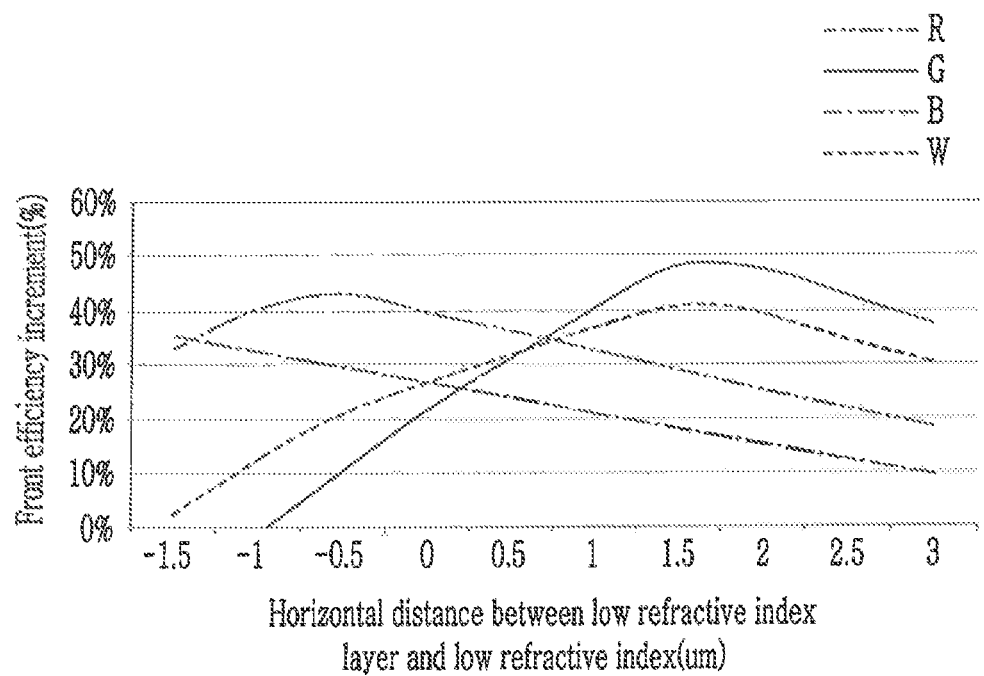
FIG. 4 is a graph illustrating a front efficiency increment with respect to a horizontal distance between a low refractive index layer and an emission region of a display device according to an exemplary embodiment of the present invention.

As shown in FIG. 4, as a horizontal distance SC between the emission region ER and the low refractive index layer 510 is larger, the front efficiency increment tends to gradually increase and then decrease again at a certain point. The emission region ER and the low refractive index layer 510 are horizontally and vertically separated from each other, and the horizontal distance SC indicates a distance between the emission region ER and the low refractive index layer 510 when viewed from a direction perpendicular to the top surface of the substrate 110. Each of the red light, the green light, and the blue light have different points where the front efficiency increment is a maximum. For white light, it is seen that when the horizontal distance SC between the emission region ER and the low refractive index layer 510 is about 1.5 μm, the front efficiency is increased by 40% to a maximum. In addition, it is seen that when the horizontal distance SC between the emission region ER and the low refractive index layer 510 is about 0.5 μm or more and about 3 μm or less, the front efficiency is increased by about 30%. Accordingly, the horizontal distance SC between the emission region ER and the low refractive index layer 510 may preferably be about 0.5 μm or more and about 3 μm or less Further, the horizontal distance SC between the emission region ER and the low refractive index layer 510 may preferably be about 1.5 μm.

A buffer layer 430 may be further disposed between the planarization layer 420 and the low refractive index layer 510. In addition, the buffer layer 430 may also be disposed between the planarization layer 420 and the high refractive index layer 520. For example, the buffer layer 430 may be entirely disposed on the planarization layer 420.

The buffer layer 430 may be made of an inorganic insulating material, and may have a single layer or a multiple layer structure. For example, the buffer layer 430 may be made of silicon nitride ($SiN_x$). The buffer layer 430 may serve to prevent penetration of unnecessary components such as oxygen and moisture therethrough.

A polarizer 610 and a cover window 620 may be disposed on the high refractive index layer 520. The polarizer 610 may be disposed between the high refractive index layer 520 and the cover window 620. However, the present invention is not limited thereto, and positions of the polarizer 610 and the cover window 620 may be changed. An additional layer may be provided, and some of the aforementioned layers may be omitted.

The cover window 620 may serve to protect the display device from external interference. The cover window 620 may be formed of a single layer or multiple layers.

Hereinafter, a thickness of the planarization layer 420 will be described with reference to FIG. 5 to FIG. 9.

Figure 5:
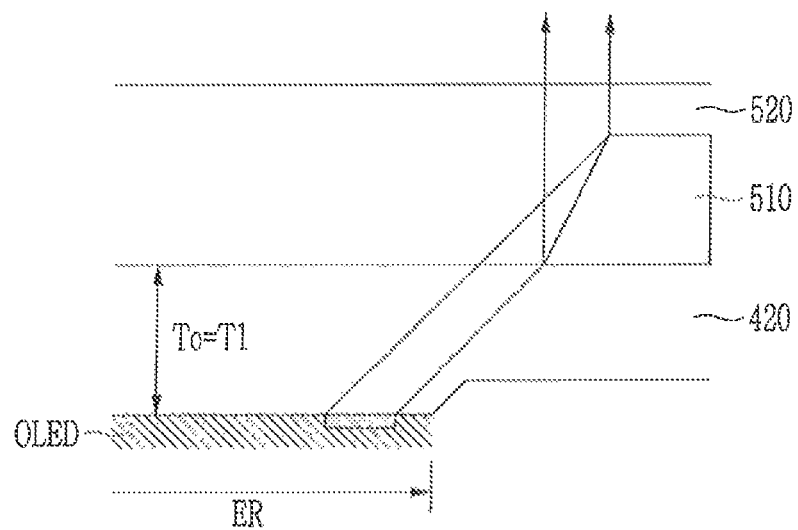
FIG. 5 is a cross-sectional view illustrating various layers of a display device according to an exemplary embodiment of the present invention.
Figure 6:
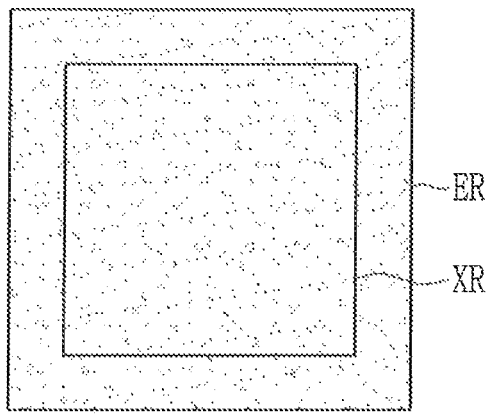
FIG. 6 is a top plan view illustrating an emission region and a light-extracting region of a display device according to an exemplary embodiment of the present invention.
Figure 7:
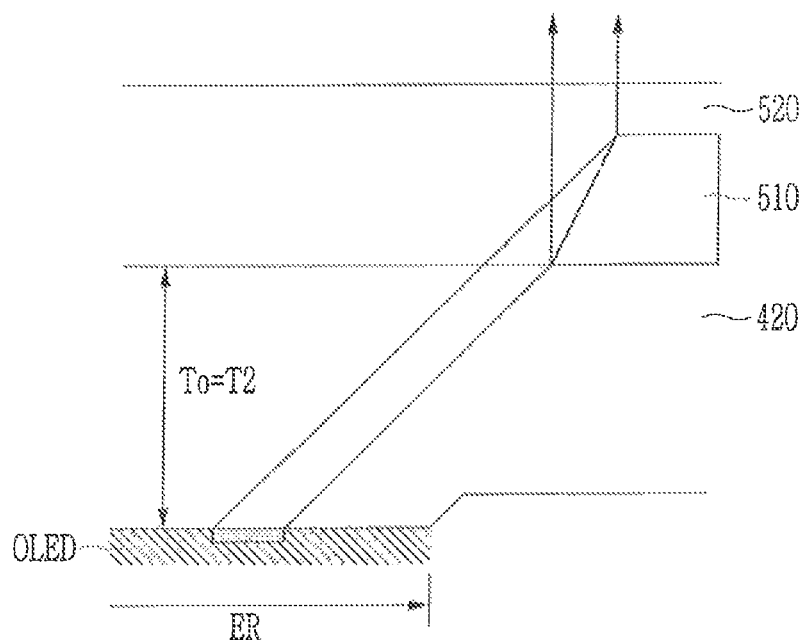
FIG. 7 is a cross-sectional view illustrating various layers of a display device according to an exemplary embodiment of the present invention.
Figure 8:
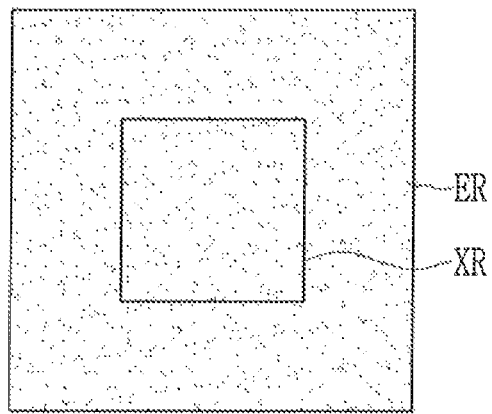
FIG. 8 is a top plan view illustrating an emission region and a light-extracting region of a display device according to an exemplary embodiment of the present invention.
Figure 9:
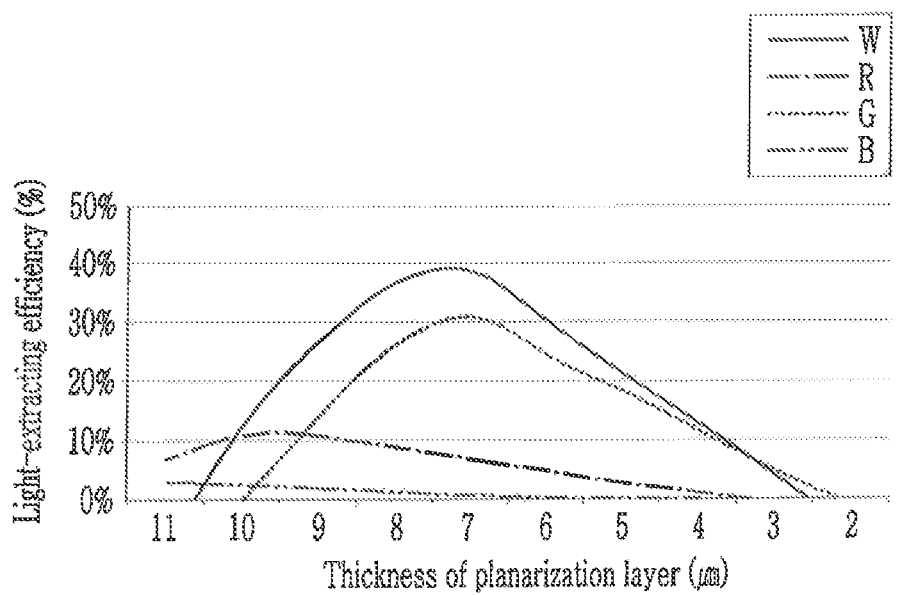
FIG. 9 is a graph illustrating light-extracting efficiency with respect to a thickness of a planarization layer according to an exemplary embodiment of the present invention.

FIG. 5 is a cross-sectional view illustrating various layers of a display device according to an exemplary embodiment of the present invention, and FIG. 6 is a top plan view illustrating an emission region and a light-extracting region of a display device according to an exemplary embodiment of the present invention. FIG. 5 and FIG. 6 illustrate a case where a thickness To of the planarization layer is a first thickness T1. FIG. 7 is a cross-sectional view illustrating various layers of a display device according to an exemplary embodiment of the present invention, and FIG. 8 is a top plan view illustrating an emission region and a light-extracting region of a display device according to an exemplary embodiment of the present invention. FIG. 7 and FIG. 8 illustrate a case where the thickness To of the planarization layer is a first thickness T2. The first thickness is different from the second thickness. FIG. 9 is a graph illustrating light-extracting efficiency depending on a thickness of a planarization layer.

As shown in FIG. 5 and FIG. 7, light extraction may be performed by allowing the light emitted from the organic light emitting diode OLED to be introduced into the low refractive index layer 510 through the high refractive index layer 520, and to be totally reflected toward a front side of the screen. FIG. 6 and FIG. 8 illustrate a light-extracting region XR where light may be extracted by a difference between refractive indexes of the high refractive index layer 520 and the low refractive index layer 510. The light-extracting region XR is disposed inside the emission region ER.

In FIG. 5, the thickness To of the planarization layer 420 is the first thickness T1. In FIG. 7, the thickness To of the planarization layer 420 is the second thickness T2, and the second thickness T2 is thicker than the first thickness T1. Referring to FIG. 5 to FIG. 8, it is seen that the light-extracting region XR is varied depending on the thickness To of the planarization layer 420. Accordingly, a change in the light-extracting efficiency may be made depending on the change in the thickness of the planarization layer 420.

Referring to FIG. 9, it is seen that when the thickness of the planarization layer 420 is about 4 μm or more and about 10 μm or less, light-extracting efficiency is about 10% or more and 40% or less. Accordingly, the planarization layer 420 may have a thickness that is in a range of about 4 μm or more and about 10 μm or less. For example, the planarization layer 420 may have a thickness that is in a range of about 7 μm or more and about 8 μm or less.

In addition, the refractive index of the planarization layer 420 is greater than that of the low refractive index layer 510, and is smaller than that of the high refractive index layer 520.

A display device according to an exemplary embodiment of the present invention may include a plurality of pixels, and the structure of one pixel has been described. Hereinafter, a planar shape and arrangement of the pixels will be described with reference to FIG. 10 to FIG. 12.

Figure 10:
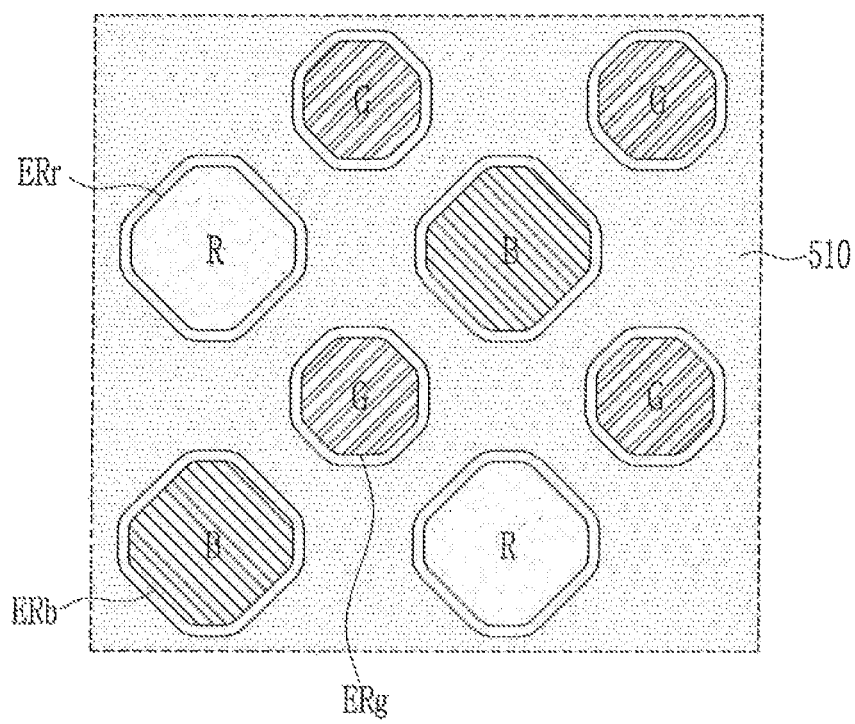
FIG. 10 to FIG. 12 are diagrams illustrating various shapes of a plurality of pixels of a display device according to an exemplary embodiment of the present invention.
Figure 11:
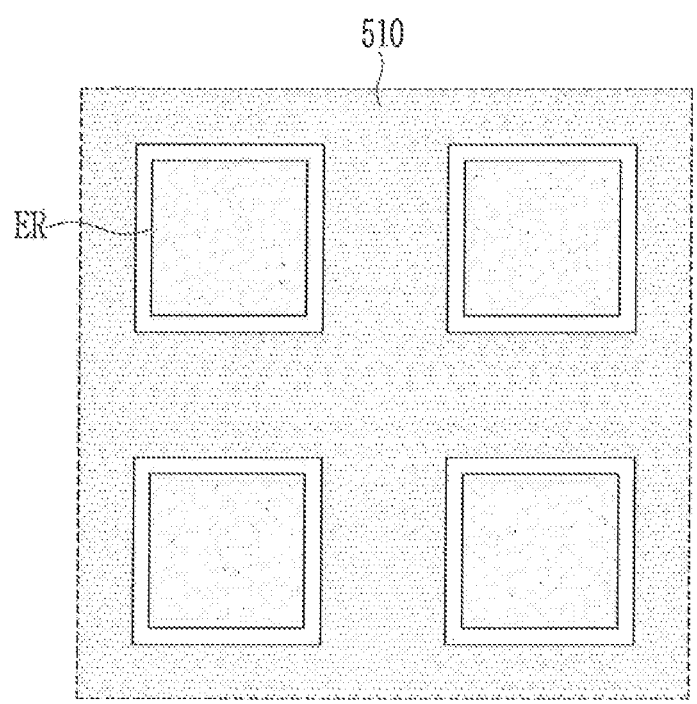
Figure 12:
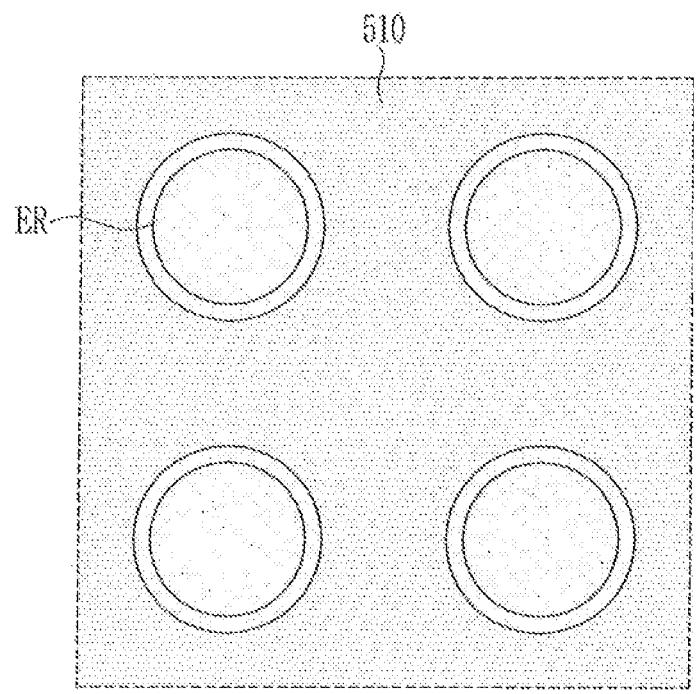

FIG. 10 to FIG. 12 illustrate various disposal shapes of a plurality of pixels of a display device according to an exemplary embodiment of the present invention.

As shown in FIG. 10, the pixels may be arranged in a pentile matrix form. The pixels may include a red emission region ERr, a green emission region ERg, and a blue emission region ERb. Each of the emission regions ERr, ERg, and ERb may be formed to have a polygonal shape such as a substantially quadrangular or octagonal shape.

The red emission region ERr and the green emission region ERg may be arranged alternately in a diagonal direction, and the blue emission region ERb and the green emission region ERg may be arranged alternately in the diagonal direction. The red emission region ERr, the green emission region ERg, and the blue emission region ERb may be respectively disposed in different pixels, and a color image may be implemented by a combination thereof.

The low refractive index layer 510 may be formed to surround the red emission region ERr, the green emission region ERg, and the blue emission region ERb. The low refractive index layer 510 might not overlap the red emission region ERr, the green emission region ERg, or the blue emission region ERb.

The shape and arrangement of the pixels is not limited thereto. For example, as shown in FIG. 11 and FIG. 12, the pixels may be disposed in a matrix form along a row direction and a column direction.

As shown in FIG. 11, emission regions ER of the pixels may have a quadrangular shape, and all of them may have a same size. Alternatively, as shown in FIG. 12, the emission regions ER of the pixels may have a circular shape.

Hereinafter, a display device according to an exemplary embodiment of the present invention will be described with reference to FIG. 13.

Figure 13:
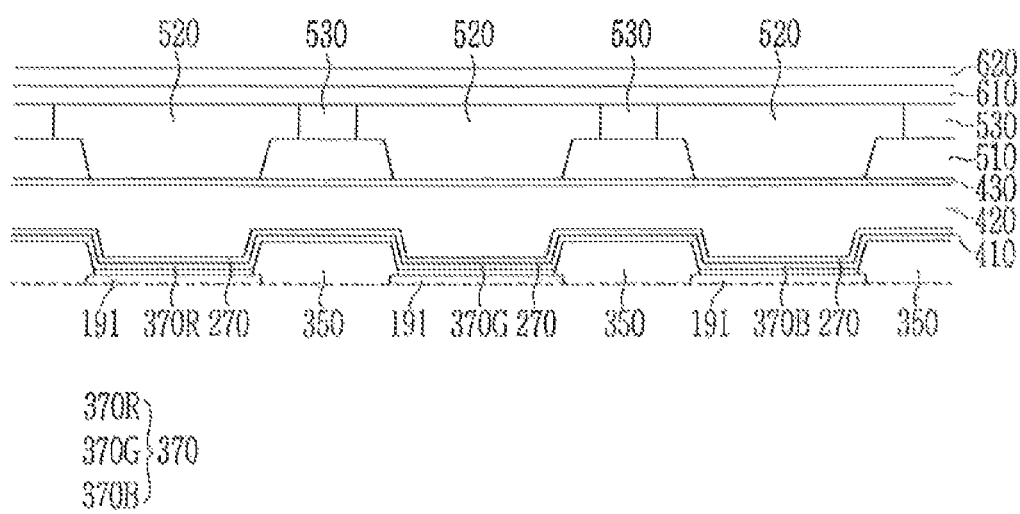
FIG. 13 is a cross-sectional view illustrating a display device according to an exemplary embodiment of the present invention.

Since the display device shown in FIG. 13 is substantially the same as the display device shown in FIG. 1, a description of similar features will be omitted and it may be assumed that where a feature of FIG. 13 is not described, that feature may be similar to or identical to a corresponding feature of FIG. 1. The arrangement of FIG. 13 is different from the aforementioned exemplary embodiment in that a light blocking member is further disposed on the low refractive index layer.

FIG. 13 is a cross-sectional view illustrating a display device according to an exemplary embodiment of the present invention. In FIG. 13, some constituent elements such as a substrate, a thin film transistor, and the like are omitted.

As shown in FIG. 13, similar to the aforementioned exemplary embodiment, the display device according to an exemplary embodiment of the present invention includes a substrate, a first electrode 191, an organic emission layer 370, and a second electrode 270 disposed on the substrate, a planarization layer 420 disposed on the second electrode 270, and a low refractive index layer 510 and a high refractive index layer 520 disposed on the planarization layer 420.

The organic emission layer 370 may include a red organic emission layer 370R, a green organic emission layer 370G, and a blue organic emission layer 370B.

The display device may further include a light blocking member 530 disposed on the low refractive index layer 510. The light blocking member 530 is disposed between adjacent emission regions. The light blocking member 530 may overlap a region between the red organic emission layer 370R and the green organic emission layer 370G, and may overlap a region between the green organic emission layer 370G and the blue organic emission layer 370B. The light blocking member 530 may overlap the low refractive index layer 510 and the pixel definition layer 350.

The light blocking member 530 includes a light-blocking material, and serves to prevent external light from being reflected and recognized.

Hereinafter, a display device according to an exemplary embodiment of the present invention will be described with reference to FIG. 14.

Figure 14:
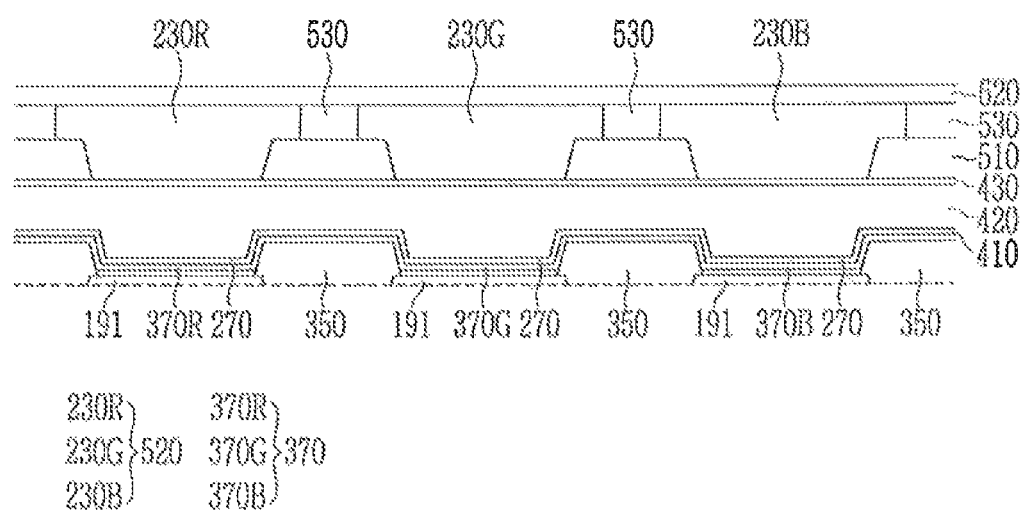
FIG. 14 is a cross-sectional view illustrating a display device according to an exemplary embodiment of the present invention.

Since the display device shown in FIG. 14 is substantially the same as the display device shown in FIG. 1, a description of similar features will be omitted and it may be assumed that where a feature of FIG. 14 is not described, that feature may be similar to or identical to a corresponding feature of FIG. 1. The arrangement of FIG. 14 is different from the aforementioned exemplary embodiment in that the high refractive index layer includes a color filter.

FIG. 14 is a cross-sectional view illustrating a display device according to an exemplary embodiment of the present invention. In FIG. 14, some constituent elements such as a substrate, a thin film transistor, and the like are omitted.

As shown in FIG. 14, similar to the aforementioned exemplary embodiment, the display device includes a substrate (not illustrated), a first electrode 191, an organic emission layer 370, and a second electrode 270 disposed on the substrate, a planarization layer 420 disposed on the second electrode 270, and a low refractive index layer 510 and a high refractive index layer 520 disposed on the planarization layer 420.

In the present exemplary embodiment, the high refractive index layer 520 may include color filters 230R, 230G, and 230B. The color filters 230R, 230G, and 230B may include a red filter 230R, a green filter 230G, and a blue filter 230B. The red filter 230R may overlap the red organic emission layer 370R, the green filter 230G may overlap the green organic emission layer 370G, the blue filter 230B may overlap the blue organic emission layer 370B.

The light blocking member 530 may be disposed between the red filter 230R and the green filter 230G, and may be disposed between the green filter 230G and the blue filter 230B.

The polarizer may be omitted by further including the color filters 230R, 230G, and 230B. Light loss occurs while the light passes through the polarizer. However, according to exemplary embodiments of the present invention, the transmittance may be further increased by omitting the polarizer.

Exemplary embodiments described herein are illustrative, and many variations can be introduced without departing from the spirit of the disclosure or from the scope of the appended claims. For example, elements and/or features of different exemplary embodiments may be combined with each other and/or substituted for each other within the scope of this disclosure and appended claims.

What is claimed is:

1. A display device comprising:
    a substrate;
    a first electrode disposed on the substrate;
    a pixel definition layer disposed on the substrate;
    a second electrode disposed on the first electrode and the pixel definition layer;
    an organic emission layer disposed between the first electrode and the second electrode;
    a planarization layer disposed on the second electrode;
    a low refractive index layer disposed on the planarization layer and overlapping the pixel definition layer; and
    a high refractive index layer disposed on the planarization layer and overlapping the second electrode,
    wherein the high refractive index layer has a higher refractive index than that of the low refractive index layer,
    wherein the low refractive index layer has a tapered shape, and
    wherein a taper angle θ of the low refractive index layer satisfies a following equation:

$$asind\left(\frac{n1}{n2}\right) \leq \theta < 90°,$$

wherein n1 is a refractive index of the low refractive index layer, n2 is a refractive index of the high refractive index layer, and asind (x) represents an angle in degrees.

2. The display device of claim 1, wherein the high refractive index layer contacts the low refractive index layer.

3. The display device of claim 2, wherein the high refractive index layer at least partially covers the low refractive index layer.

4. The display device of claim 3, wherein a top surface of the high refractive index layer is substantially planar.

5. The display device of claim 1, wherein a thickness of the low refractive index layer is 4 μm or more and 8 μm or less.

6. The display device of claim 5, wherein the thickness of the low refractive index layer is substantially 5 μm.

7. The display device of claim 1, wherein an emission region is separated from the low refractive index layer.

8. The display device of claim 7, wherein a horizontal distance between the emission region and the low refractive index layer is 0.5 μm or more and 3 μm or less.

9. The display device of claim 8, wherein the horizontal distance between the emission region and the low refractive index layer is substantially 1.5 μm.

10. The display device of claim 1, wherein a thickness of the planarization layer is 4 μm or more and 10 μm or less.

11. The display device of claim 1, wherein a refractive index of the planarization layer is greater than that of the low refractive index layer, and is smaller than that of the high refractive index layer.

12. The display device of claim 1, wherein the substrate includes a plurality of pixels, and
    each of the plurality of pixels are arranged in an orthogonal matrix form or a pentile matrix form.

13. The display device of claim 12, wherein an emission region of each of the plurality of pixels has a circular shape.

14. The display device of claim 12, wherein an emission region of each of the plurality of pixels has a polygonal shape.

15. The display device of claim 1, further comprising a first buffer layer disposed between the second electrode and the planarization layer.

16. The display device of claim 1, further comprising a polarizer disposed on the high refractive index layer.

17. The display device of claim 1, further comprising a cover window disposed on the high refractive index layer.

18. The display device of claim 1, further comprising a light blocking member disposed on the low refractive index layer.

19. The display device of claim 1, wherein the high refractive index layer includes a color filter.

20. A display device comprising:
a substrate;
a first electrode disposed on the substrate;
a pixel definition layer disposed on the substrate;
a second electrode disposed on the first electrode and the pixel definition layer;
an organic emission layer disposed between the first electrode and the second electrode;
a planarization layer disposed on the second electrode;
a low refractive index layer disposed on the planarization layer and overlapping the pixel definition layer;
a high refractive index layer disposed on the planarization layer and overlapping the second electrode; and
a second buffer layer disposed between the planarization layer and the low refractive index layer, and between the planarization layer and the high refractive index layer,
wherein the high refractive index layer has a higher refractive index than that of the low refractive index layer.

21. The display device of claim 20, wherein the high refractive index layer contacts the low refractive index layer.

22. The display device of claim 21, wherein the high refractive index layer at least partially covers the low refractive index layer.

23. The display device of claim 22, wherein a top surface of the high refractive index layer is substantially planar.

24. The display device of claim 20, wherein a thickness of the low refractive index layer is 4 μm or more and 8 μm or less.

25. The display device of claim 24, wherein the thickness of the low refractive index layer is substantially 5 μm.

26. The display device of claim 20, wherein an emission region is separated from the low refractive index layer.

27. The display device of claim 26, wherein a horizontal distance between, the emission region and the low refractive index layer is 0.5 μm or more and 3 μm or less.

28. The display device of claim 27, wherein the horizontal distance between the emission region and the low refractive index layer is substantially 1.5 μm.

29. The display device of claim 20, wherein a thickness of the planarization layer is 4 μm or more and 10 μm or less.

30. The display device of claim 20, wherein a refractive index of the planarization layer is greater than that of the low refractive index layer, and is smaller than that of the high refractive index layer.

31. The display device of claim 20, wherein the substrate includes a plurality of pixels, and
each of the plurality of pixels are arranged in an orthogonal matrix form or a pentile matrix form.

32. The display device of claim 31, wherein an emission region of each of the plurality of pixels has a circular shape.

33. The display device of claim 31, wherein an emission region of each of the plurality of pixels has a polygonal shape.

34. The display device of claim 20, further comprising a first buffer layer disposed between the second electrode and the planarization layer.

35. The display device of claim 20, further comprising a polarizer disposed on the high refractive index layer.

36. The display device of claim 20, further comprising a cover window disposed on the high refractive index layer.

37. The display device of claim 20, further comprising
a light blocking member disposed on the low refractive index layer.

38. The display device of claim 20, wherein the high refractive index layer includes a color filter.

* * * * *